United States Patent [19]

Plihal et al.

[11] Patent Number: 4,730,330
[45] Date of Patent: Mar. 8, 1988

[54] INTEGRATED STRUCTURE FOR BI-DIRECTIONAL OPTICAL FIBER TRANSMISSION

[75] Inventors: Manfred Plihal; Heinrich Schlötterer; Reiner Trommer, all of Munich, Fed. Rep. of Germany

[73] Assignee: Siemens Aktiengesellschaft, Berlin and Munich, Fed. Rep. of Germany

[21] Appl. No.: 812,468

[22] Filed: Dec. 23, 1985

[30] Foreign Application Priority Data

Jan. 7, 1985 [DE] Fed. Rep. of Germany ....... 3500327
Sep. 9, 1985 [EP] European Pat. Off. ...... 85 111 386.0

[51] Int. Cl.$^4$ ..................... H01S 3/19; H01L 31/12; G02B 6/26
[52] U.S. Cl. .................... 372/50; 350/96.15; 350/96.19; 357/19; 372/96
[58] Field of Search ............ 372/50, 96; 357/19; 350/96.18, 96.19, 96.15, 96.12

[56] References Cited

U.S. PATENT DOCUMENTS 4,136,928 1/1979 Logan et al. ..................... 372/50

OTHER PUBLICATIONS

Shams et al., "Monolithic Integration of LOC-DBR Lasers and Optical Components", Meeting of Integrated and Guided Wave Optics, Jan. 16–18, 1978, pp. MDS-1-4.

"A Frequency-Multiplexing Light Source with Monolithically Integrated Distributed-Feedback Diode Lasers", Aiki et al., IEEE Journal of Quantum Electronics, vol. QE-13, No. 4, Apr. 1977.

Primary Examiner—James W. Davie
Assistant Examiner—Georgia Y. Epps
Attorney, Agent, or Firm—Hill, Van Santen, Steadman & Simpson

[57] ABSTRACT

An integrated structure for bi-directional optical fiber transmission has a laser diode, a photodetector, and a bi-directional optical waveguide integrated on a common substrate, the waveguide guiding radiation from the laser diode out of the structure and directing incoming radiation of a different wavelength through the structure to the photodetector. The structure also includes a passive optical component cooperating with the strip waveguide for substantially isolating the radiation propagated in one direction in the waveguide from the laser diode, and substantially isolating the radiation propagated in the opposite direction in the waveguide from the photodetector. A method for manufacturing this structure includes essentially growing two epitaxial multi-layer structures spaced from each other and covering selected portions of the substrate constituting the laser diode and the photodetector, with the strip waveguide extending therebetween.

23 Claims, 7 Drawing Figures

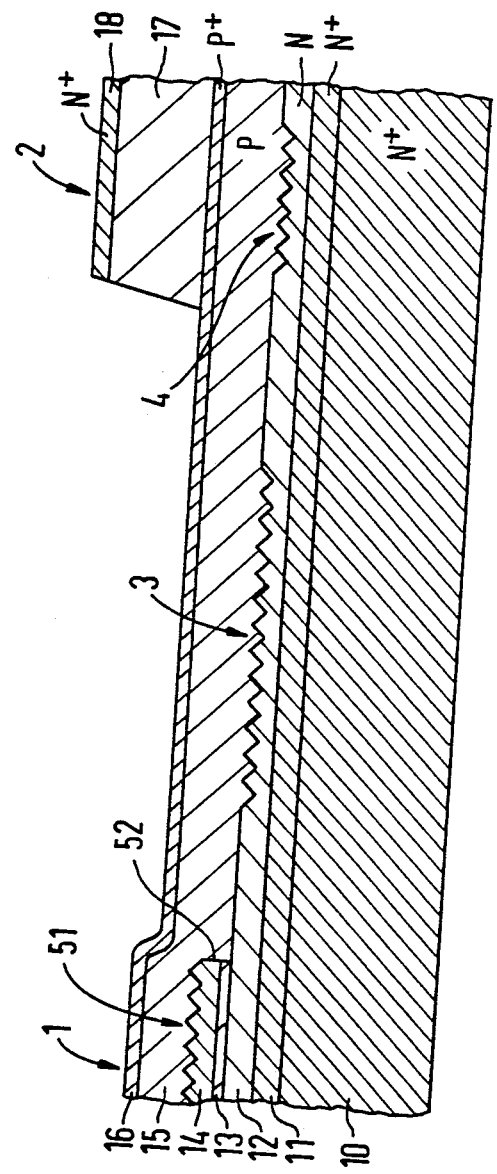

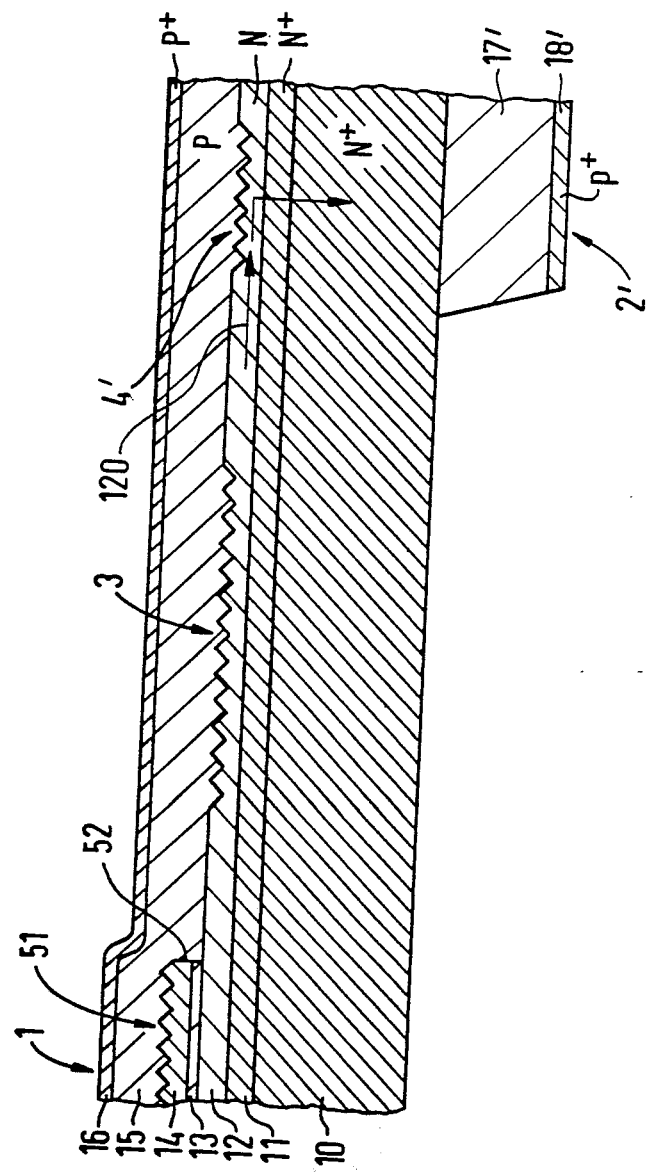

INTEGRATED STRUCTURE FOR BI-DIRECTIONAL OPTICAL FIBER TRANSMISSION

BACKGROUND OF THE INVENTION

1. Field of the Invention

The present invention relates to an integrated structure for bi-directional optical transmission and a method for manufacturing such a structure.

2. Description of the Prior Art

Hybrid structures for bi-directional optical fiber transmission are known in the art which employ, for example, an optical fiber arrangement wherein electromagnetic radiation of a first wavelength is transmitted in one direction within the optical fiber arrangement, and electromagnetic radiation of a different wavelength is transmitted in the opposite direction. Such hybrid structures require a transmission element, a receiver element, and a passive optical component, such as a wavelength selecting component, at each of the link ends. Construction of such an arrangement in hybrid form, that is, by combining a number of discrete components, is highly work-intensive and expensive, making such hybrid structures unsuitable for subscriber terminals wherein the size, stability and cost factors are determinative.

SUMMARY OF THE INVENTION

It is an object of the present invention to provide a relatively inexpensive, stable structure for bi-directional optical transmission which can be manufactured in large numbers without the use of discrete components.

The above object is inventively achieved in a structure wherein a laser diode and a photodetector are separately applied by a series of epitaxial layers to a substrate, to which a strip waveguide has already been epitaxially applied. Passive optical devices are generated in the waveguide, such as gratings, for substantially isolating radiation propagated in one direction in the waveguide from the laser diode, and substantially isolating radiation propagated in the opposite direction in the waveguide from the photodetector. The strip waveguide directs radiation from the laser diode out of the structure, and directs incoming radiation of a different wavelength through the structure to the photodetector.

In working toward a simple solution to combining these components into one integrated structure, certain difficulties had to be overcome. In order to obtain a completely integrated manufacturing procedure for a multiplex-demultiplex arrangement for bi-directional optical transmission, at least one laser diode, one photodetector (such as, for example, a photodiode as well as a waveguide and passive optical components (such as, for example, wavelength selecting components), must be constructed on a single substrate, i.e., monolithically. Combining such structures in a monolithically integrated element raises considerable problems because the layer structures and layer properties for such components deviate considerably from each other. For example, the layer structure and layer properties of a laser diode are significantly different from those of a detector diode.

Integration of a DFB laser diode with a strip waveguide is described in U.S. Pat. No. 4,656,636. The use of InGaAsP layers, i.e., Q layers, is essential. Ternary layers of InGaAs are considered first and foremost for photodiodes. A reason resulting in considerable problems in the combination of such elements on a common substrate is that layer stacks constructed with quaternary layers, and those constructed with ternary layers, differ in terms of layer sequence and are not adapted to each other.

The solution to these problems disclosed herein is based on the perception that, with only two epitaxial steps, i.e. with only two epitaxial layers sequences, the necessary stacks can be generated of a proper type and in a proper sequence such that as many layers as needed can be utilized in common for individual components, while the components themselves can be locally isolated by selectively removing layers not required to be in common. Using this method, despite the apparent incompatibility of the two layer systems, as large a number of process steps as needed can be used in common for all components, and the number of process steps can be maintained to a minimum.

In one embodiment of the integrated structure disclosed herein, a strip or film waveguide extending from the laser diode to a wavelength selecting grading and in turn to the photodetector is provided. This embodiment is useful for generating a monolithically integrated multiplex-demultiplex module.

In another embodiment of the invention, the laser diode is a DFB laser diode coupled to the strip or film waveguide. Such laser diodes may be manufactured as described in the aforementioned German patent application No. P 34 36 306.8 U.S. Pat. No. 4,656,636. Only one additional step is needed for manufacturing the photodetector, as described in detail below. The structure described herein can be manufactured with only two epitaxial steps. For this purpose, the laser diode, the strip waveguide, and the photodetector are disposed on the same side of the substrate, and the photodetector is coupled to the strip waveguide by a deflector element or by end face coupling. Such a deflector element is a passive optical component and can be generated by structuring the strip waveguide, such as by generating a grating thereon. End face coupling between the strip waveguide and the photodetector can be achieved in the same manner as end face coupling between a laser active layer and a strip waveguide, as described, for example, in IEEE Journal of Quantum Electronics, Vol. QE-13, No. 4, April 1977 at pages 220-223. The structure described in this IEEE publication, however, requires a gap in the epitaxial applied covering layers, which is superfluous for the structure disclosed herein.

In another embodiment of the invention, the laser diode and the strip waveguide are disposed on one side of the substrate, and the photodetector is disposed at the opposite side (the opposite major surface) of the substrate, and the photodetector is coupled to the strip waveguide by a deflector element which deflects radiation conducted in the waveguide out of the waveguide through the substrate to the photodetector. In this embodiment, wherein the deflector element can again be realized by structuring the strip waveguide, more than two epitaxial manufacturing steps are required, however, the advantage of this arrangement is that the technological steps for manufacturing the laser diode coupled with the waveguide and the steps for generating the photodetector, can be implemented largely independently of each other. In this embodiment, the substrate must be transmissive for the radiation guided in the strip waveguide.

As stated above, the deflector elements may be deflection gratings fashioned on or in the strip waveguide. The deflector elements may also be a mirror (i.e. radiation reflective) face disposed obliquely relative to the propagation direction of the radiation in the waveguide.

Coupling between the laser diode and the strip waveguide can occur in a known manner by end face coupling or by surface coupling or by leakage wave coupling, as described in the aforementioned German patent application No. P 34 36 306.8. In a further embodiment of the invention, the laser diode is coupled to the strip waveguide by surface coupling and a mirror face is disposed obliquely relative to the propagation direction of the laser emission at at least one end face of the laser diode. Coupling between the laser diode and the waveguide can be considerably improved by such a mirror face. The mirror face can be easily generated by an obliquely proceeding etching edge The photodetector may be a photodiode or a phototransistor.

As described above, at least one advantage of the structure disclosed herein is that the structure can be very easily manufactured with only two epitaxial steps. A layer stack is generated on the substrate in a first epitaxial step which includes a laser-active layer and a layer disposed beneath the laser active layer which forms the waveguide. Another layer is disposed between the waveguide and the substrate. The refractive index of the waveguide layer is greater than that of the layer immediately therebelow and smaller than that of the active layer. A portion of the first epitaxial layer stack is removed outside of the region desired for the laser diode, the stack being removed down to the waveguide layer. In a second epitaxial step, at least three further layers are generated surface-wide on the exposed surface which has thus arisen, with the layer in this second epitaxially generated structure which is immediately above the strip waveguide layer having a lower refractive index than the strip waveguide layer. The uppermost layer in the second epitaxially generated structure has a region which is doped oppositely to the doping of the layer disposed immediately therebelow.

This method differs from the method for manufacturing a laser diode coupled to a waveguide described in the aforementioned German patent application by the generation of one or more additional layers in the second epitaxial step, with a defined doping being formed therein. The oppositely doped region may be an epitaxial layer, or may be generated by diffusion in an existing layer. For example, the uppermost of the layer structure generated in the second epitaxial step may be an undoped layer in which the necessary doping is generated by diffusion. This layer may alternatively be a double layer wherein one layer is undoped and the other is doped as needed. This double layer, as stated above, can be generated in the second epitaxial layer structure, so that diffusion is then not needed.

If further passive optical components are to be generated by structuring the strip waveguide, such structuring can be undertaken before the second epitaxial step and after the selected removal of a portion of the layer stack generated in the first epitaxial step.

After the second epitaxial layer structure has been generated, the uppermost of the layers in that structure, and if necessary, further layers lying therebelow, can be removed beyond the region desired for the photodetector.

As stated above, a monolithically integrated multiplex-demultiplex module can be generated by the method described herein. Other arrangements which can be generated using the basic method disclosed herein are, for example, a monolithic heterodyne receiver or a homodyne receiver. In both such structures, laser diodes and photodiodes must be integrated with each other and with other optical components.

DESCRIPTION OF THE DRAWINGS

FIG. 1 is a longitudinal section taken in the radiation propagation direction through a monolithically integrated multiplex-demultiplex module constructed in accordance with the principles of the present invention wherein the photodetector and laserdiode are on the same side of the substrate.

FIG. 1A is a longitudinal section taken in the radiation propagation direction of a further embodiment of the module shown in FIG. 1 wherein the laserdiode and the photodetector are disposed on opposite sides of the substrate.

DESCRIPTION OF THE PREFERRED EMBODIMENTS

Figure 2:
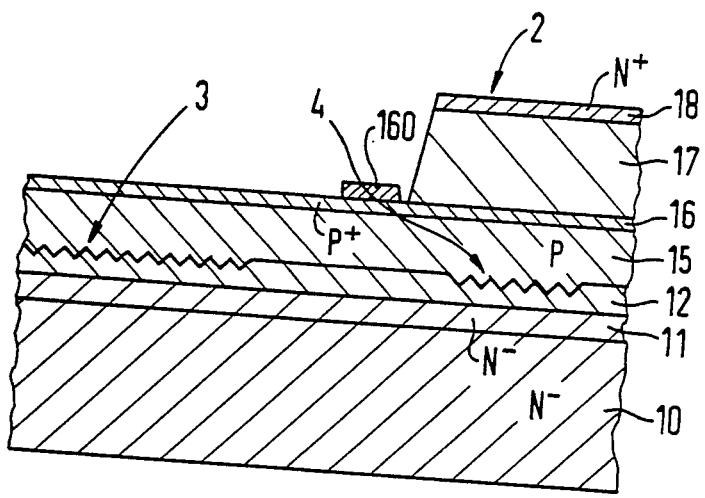
FIG. 2 is a portion of a sectional view of a second embodiment of the module shown in FIG. 1 wherein the contracts for operating the photodetector are disposed on one side of the substrate.

In the multiplex-demultiplex module of FIG. 1, a DFB laser diode 1 is coupled to a strip or film waveguide 12. These components are constructed of layers 11 through 16 generated on a substrate 10. This structure essentially corresponds to that described in the aforementioned U.S. Pat. No. 4,656,636 but differs therefrom in that a wavelength selecting grating 3 and a deflection grating 4, which are both introduced into the layer 12 forming the strip waveguide, are present in accordance with the principles of the invention disclosed herein. Otherwise, the layer sequence of the layers 11 through 16 in FIG. 1 corresponds to the layer sequence 1, 2 and 4 through 7 in FIG. 3 of that patent. In that patent, a thin etch stop layer 3 is disposed between the layers 2 and 4 (which correspond to the layers 12 and 13 in FIG. 1 of the present application) and such an etch stop layer 3 may be utilized in the module of FIG. 1 herein, but is not necessary. It can be assumed for the purpose of the following discussion that if such an etch stop layer is present, that layer is a component of the layer 12.

In the module shown in FIG. 1, the substrate 10 consists of InP having a n+ doping in the range of $10^{17}$ to $10^{18}$. The layer 11 consists of the same material and has a thickness, for example, of 0.5 μm. The layer 12 is a Q layer, i.e., a layer of quaternary material. The quaternary material, for example, may be InGaAsP or InGaAlAs. In the example shown in FIG. 1, all Q layers consist of InGaAsP.

The layer 12 has an n doping of at most $10^{17}$, a thickness between 0.3 and 0.5 μm, and a band gap corresponding to a fluorescent wavelength of approximately 1.3 μm.

If an etch stop layer is applied to the layer 12, the etch stop layer may, for example, consist of InP. Such an etch stop layer may, for example, have a thickness of 0.1 μm and an n doping of $10^{17}$.

A laser-active layer 13 is disposed above the layer 12 and consists of an undoped or self-conducting Q layer having, for example, a layer thickness of 0.2 μm and a band gap corresponding to a fluorescent wavelength of 1.55 μm.

A layer 14 disposed above the layer 13 has a grating 51 for the DFB laser diode. The layer 14 consists of a p doped Q layer having, for example, a thickness of 0.3 μm and a band gap corresponding to a fluorescent wavelength of 1.3 μm.

A further layer 15 consists of InP and may have, for example, a p doping of $10^{17}$ and a thickness in the range of 1.0 through 1.5 μm. A layer 16 is a Q layer having a p+ doping of, for example, $10^{18}$, a thickness of, for example, 0.2 μm and, for example, a band gap corresponding to a fluorescent wavelength of 1.2 μm. Instead of p doping, the two layers 15 and 16 could consist of material having an n doping of, for example, $10^{17}$.

Figure 3:
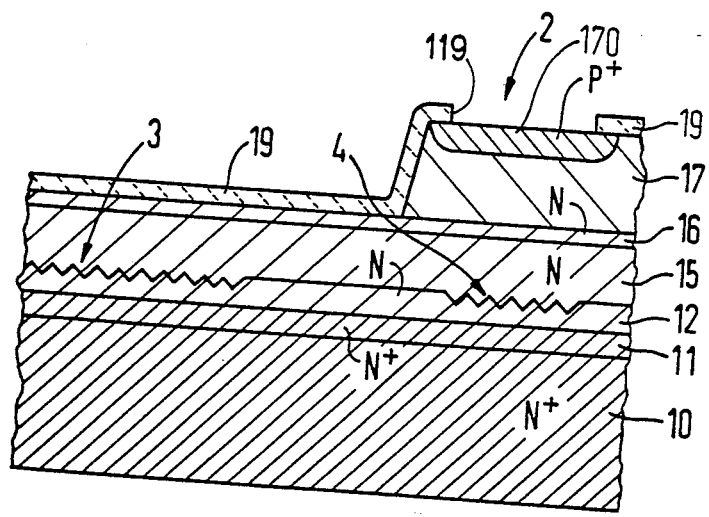
FIG. 3 is a portion of a sectional view in a further embodiment of the module of FIG. 1 wherein the doped region in the photodiode is generated by diffusion.

As stated above, the portion of the module of FIG. 1 just described essentially corresponds to the DFB laser diode coupled to a strip waveguide according to FIG. 3 of U.S. Pat. No. 4,656,636. The DFB laser diode 1 in FIG. 1 of the present application is that portion of the structure to the left of the step 52.

In the module of FIG. 1, a wavelength selecting grating 3 and a photodetector 2, such as a photodiode, with a deflection grating for disposed therebelow are also additionally present.

The photodiode is constructed with an undoped layer 17 of ternary material, for example, InGaAs, applied adjacent to the layer 16, and with a layer 18 of ternary material applied to the layer 17, which may also consist of InGaAs, and which has a doping opposite to the doping of the layer 16. The layer 17 may have a thickness of 3 μm. The layer 18 has n+ doping of, for example, $10^{18}$ and a thickness of, for example, 0.2 μm. The layer 18 could be a p+ layer of corresponding doping density if the layer 16 were an n+ doped layer.

In order for a radiation guided in the strip waveguide formed by the layer 12 to proceed into the photodiode 2, the deflection grating 4 is disposed below the photodiode 2 in the layer 12. The deflection grating 4 deflects at least a portion of the guided radiation to the photodiode 2.

The wavelength selecting grating 3, forming the actual demultiplexer, is fashioned in the layer 12 between the laser diode 1 and the photodiode 2. The parallel grooves of the grating 3 proceed obliquely to the plane of the drawing in a plane parallel to the layer 12 and vertical with respect to the plane of the drawing of FIG. 1. This grating forms the actual multiplexer and demultiplexer of the module.

In the module of FIG. 1, contacts which are required for operating the laser diode 1 and the photodiode 2 are applied in the region of the laser diode 1 such as on the layer 16, and in the region of the photodiode 2, such as on the layer 18. In addition, at least one contact is applied to the substrate 10.

Before the manufacturing steps for constructing the module of FIG. 1 are described below in greater detail, the manner of operation of the module will be briefly explained. Electromagnetic radiation having a wavelength $\lambda_1$ which is generated by the laser diode 1 is partially coupled as a leakage wave into the strip waveguide formed by the layer 12 disposed beneath the laser-active layer 13, and proceeds in the waveguide through the wavelength selecting grating 3. The grating 3 prevents the radiation from proceeding to the integrated photodetector 2. The electromagnetic radiation of wavelength $\lambda_1$ proceeds to the end of the module and is coupled therefrom into an optical fiber. Electromagnetic radiation having a wavelength $\lambda_2$, arriving from the opposite transmission direction, is coupled from the optical fiber transmission element into the waveguide 12, and proceeds through the wavelength of selecting grating 3 to the photodetector 2. The wavelength selecting grating 3 now functions to prevent this incoming radiation having the wavelength $\lambda_2$ from proceeding to the laser diode 1.

The process steps for manufacturing the module shown in FIG. 1 are as follows. The layers 11 through 14 are first generated surface-wide on the substrate 10 in a first epitaxial step. The layers 13 and 14 are then selectively removed outside of the region desired for the laser diode 1, so that the step 52 results. The gratings 51, 3 and 4 are then generated on the stepped surface which has thus arisen. For this purpose, the various grating structures are exposed in one or more steps by laser light or with electron beams at those locations at which the gratings are desired, and the grating structures are then etched into the layers 12 and 14. This can be done by conventional etching. In a second epitaxial step, the layers 15 through 18 are grown over the stepped surface with the etched grating structures thereon. The layers 17 and 18 are then selectively removed outside of the region desired for the photodetector 2. Finally, the metal contacts required for operating the laser diode 1 and the photodetector 2 are applied. The manufacturing method described above, differs from the method set forth in the aforementioned German patent application in that the layer 12 is structured after the selective removal of the layers 14, and before the second epitaxial step takes place, as well as by the generation of three or more layers in the second epitaxial step, and the selective removal of those layers. Another difference is that the grating structure in the layer 14 and the method described in the German Patent application is generated surface-wide before the selective removal of the layers 13 and 14. The method described herein could also, for example, be conducted in such a manner. After selective removal of the layers 13 and 14, only the layer 12 would then have to be structured. A further embodiment of the module is shown in FIG. 1A, which differs from the module of FIG. 1 in that the deflection grating 4 therein is replaced by a deflection grating 4', which guides a beam 120 supplied in the waveguide into the substrate 10, and the photodetector 2 is replaced by the photodetector 2' disposed on the opposite side of the substrate 10 from the laserdiode. Radiation deflected by the grating 4' is incident on the photodetector 2'.

The deflection grating 4' differs from deflection grating 4 in that the lattice constant and the shape of the grooves are adapted to the radiation such that a downward deflection occurs. The photodetector 2' consist of a layer 17' of undoped ternary material applied directly to the underside of the substrate 10, and a layer 18' of ternary material doped opposite to the substrate 10, the layer 18' being applied to the layer 17' and consisting, for example, of p+ doped material.

The contacts which are required for operation of the laserdiode 1 and photodetector 2' in the embodiment of FIG. 1A are applied in the region of the laserdiode 1 on the layer 16, and in the region of the photodetector 2' on the layer 18', and again at least one contact is applied to the substrate 10.

The relevant portion of another embodiment of the module of FIG. 1 is shown in FIG. 2, wherein only the half of the module to the right of the grating 3 is shown. In this embodiment, the substrate 10 is semi-insulating. For this reason, not only the layer 18, but also the layer 16 must be additionally provided with a contact for operating the photodetector 2. This additional contact is schematically indicated at position 160. The layer 12 must be of the same conductivity type as the layers 15 and 16. In a similar manner, the laser diode has a contact on layer 11 or 12.

In the modules of FIGS. 1 and 2, the two additional layers 17 and 18 were applied in the second epitaxial step, with the layer 18 having the doping necessary for contacting the photodiode 2. The necessary doping, however, may alternatively be introduced by diffusion into the undoped layer 17. FIG. 3 shows such an embodiment of the module of FIG. 1. In this embodiment, the substrate and the layer 11 are n+ doped, and thus conductive. The layers 12, 15 and 16 are also n doped. The layer 17 is undoped, but has a p+ doped region 170 at its uppermost side facing away from the substrate 10. The p+ doped region 170 was generated by local diffusion. The region 170 replaces the layer 18. A cover layer 19 also functions as a diffusion mask. The layer 19 is applied after the selective removal of the layer 17, and has an opening 119 therein through which the diffusion material can be introduced, and which provides a means for attaching the contact for the p+ doped region 170.

In the embodiment of FIG. 3, the layers 12, 15 and 16 are n doped, in contrast to the embodiments in FIGS. 1 and 2. The region 170 must therefore be p doped. This doping sequence requires that such deep doping must be undertaken in the region of the laser diode 1, for example, by diffusion, that the layers 14 and 15 in that region become completely p type material.

Figure 4:
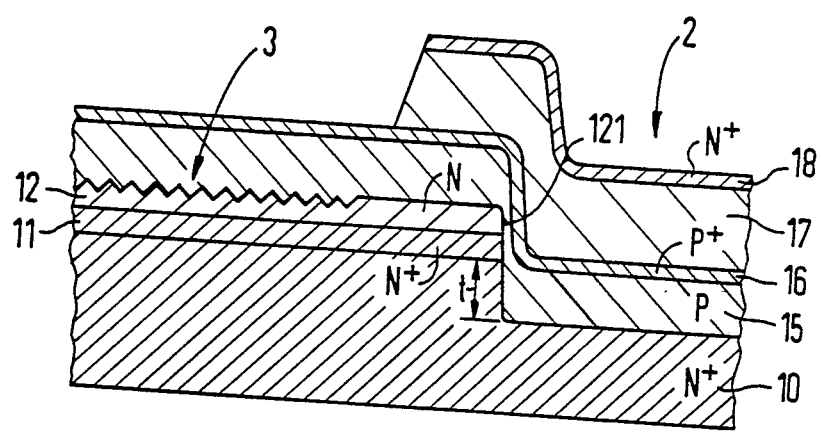
FIG. 4 is a portion of a sectional view through a module of the type shown in FIG. 1 wherein the strip waveguide is coupled to the photodetector by end face coupling.

A further embodiment is shown in FIG. 4 wherein end face coupling is achieved between the strip waveguide formed by the layer 12 and the photodetector 2. For this purpose, following the first epitaxial step, but before the second epitaxial step, another processing step is needed in addition to the step of structuring the layer 12. In this additional step, the layer stack consisting of the layers 11 through 14 applied in the first epitaxial step and the substrate are locally removed to a selected depth in the desired region of the photodetector 2. The depth t down to which the substrate 10 is locally removed is selected such that, after application of the layers 15, 16, 17 (and, under certain conditions, layer 18) the layer 12 and the layer 17 are disposed at substantially the same level in the region of the photodetector 2. Radiation which propagates in the layer 12 from the grating 3 in the direction of the photodetector 2 emerges from the end face 121 of the layer 12 which has been generated by this additional method step. The radiation propagates through the layers 15 and 16 substantially perpendicularly, and penetrates into the layer 17 at the same level. A deflection is thus no longer required at this location.

A slanted or oblique radiation-reflecting surface, which can be generated in a simple manner by oblique disposition of the step 52 in FIG. 1 and the other embodiments, contributes to better coupling of the radiation from the laser-active layer 13 into the strip waveguide formed by the layer 12.

Figure 5:
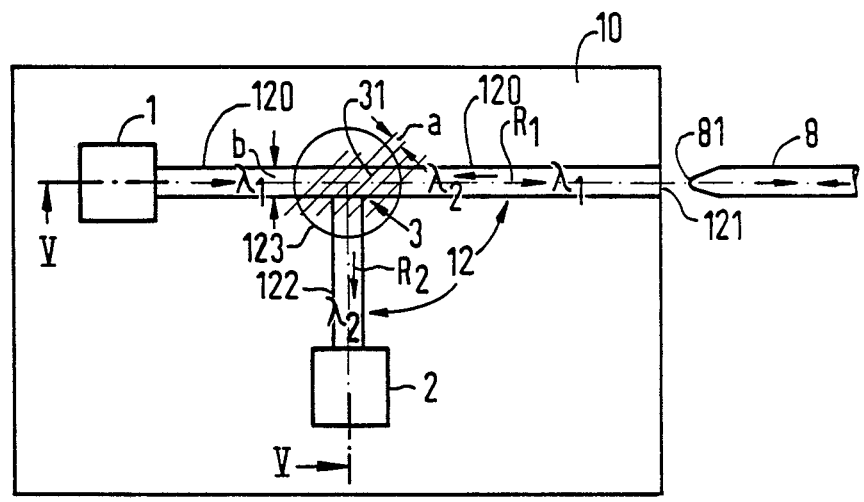
FIG. 5 is a plan view of a first embodiment of a multiplex-demultiplex module constructed in accordance with any of the embodiments shown in FIGS. 1 through 4 showing the arrangement of components, the sectional views of FIGS. 1 through 4 being taken along line V—V and "unfolding" the perpendicular portions of that section into a single plane.

In the multiplex-demultiplex module shown in plan view in FIG. 5, the laser diode 1 and the photodetector 2 are schematically represented by boxes. The structured strip waveguide formed by the layer 12 in FIGS. 1 through 4 is shown in FIG. 5 as a waveguide section 120 leading, for example, on a straight line from the laser diode 1 to an edge of the substrate 10, and terminating at that location, as well as being represented by a strip waveguide section 122 branching therefrom and leading to the photodetector 2. The branch strip waveguide section 122 is immediately adjacent to the strip waveguide section 120.

A wavelength selecting deflection grating 3 is used as a deflector element, which occupies at least the width b of the strip waveguide section 120. The grating 3 is applied on the structured strip waveguide 12 in the region 123 of the branching connection. The grating strips 31 proceeding parallel to the plane of the drawing of FIG. 5 and, for example, formed by grooves, proceed obliquely with respect both to the radiation propagation direction $R_1$ of the radiation in the strip waveguide section 120 and to the radiation propagation direction $R_2$ of the radiation guided in the branching strip waveguide section 122.

The slanting angle of the grating strips 31 and the grating constant a of the deflection grating 3 are selected such that radiation of a first wavelength $\lambda_1$ emitted by the laser diode 1 is guided in the strip waveguide section 120 past the branching strip waveguide section 122 to the edge of the substrate 10. This radiation is coupled therefrom at the end 121 of the strip waveguide section 120 and may, for example, be coupled into an optical fiber 8 which may have a tapered end 81 disposed opposite the end 121 for this purpose. Incoming radiation of another wavelength $\lambda_2$, coupled from the optical fiber 8 into the strip waveguide section 120 is coupled into the branching strip section 122 and is conducted to the photodecor 2. A significant component of the radiation of wavelength $\lambda_1$ is blocked from the photodetector 2, and a significant component of the radiation having the other wavelength $\lambda_2$ is blocked from the laser diode 1.

Figure 6:
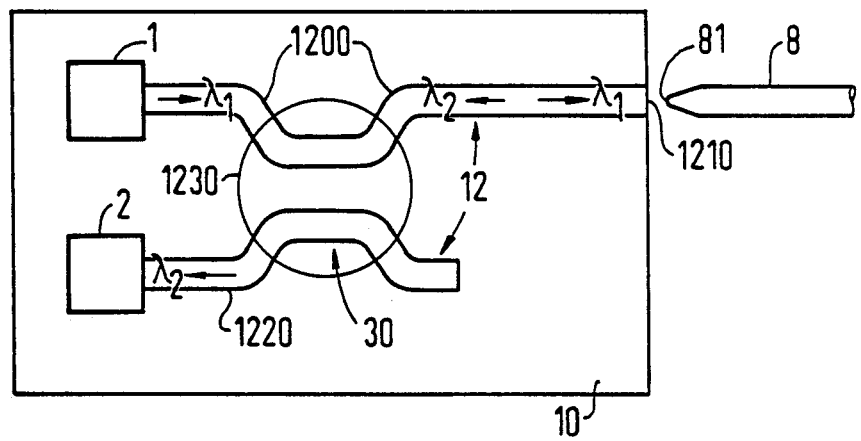
FIG. 6 is a plan view of a further embodiment of a multiplex-demultiplex module constructed in accordance with the principles of the present invention.

The multiplex-demultiplex module shown in plan view in FIG. 6 differs from the module of FIG. 5 in that a wavelength selecting directional coupler 30 is used instead of a wavelength selecting branching grating 3. The laser diode 1 and the photodetector 2 in the module of FIG. 6 are the same as in the module of FIG. 5, and are therefore identified with the same reference symbols, the same being true for the optical fiber 8.

The strip waveguide section 120 and end face 121 of FIG. 5 correspond to the strip waveguide 1200 and end face 1210 in FIG. 6. The other strip waveguide section 1220 in FIG. 6 corresponds to the branching strip waveguide section 122 in FIG. 5.

In the region 1230 of the branching in FIG. 6, the branching strip waveguide section 1220 is coupled to the strip waveguide section 1200 via the wavelength selecting optical directional coupler 30, which forms the deflector element. For this purpose, for example, in the region 1230 of the branching, the two strip waveguides sections 1200 and 1220 proceed at such a small spacing next to each other along selected sections thereof so that radiation of the wavelength $\lambda_2$ can be coupled between those sections, whereas radiation of wavelength $\lambda_1$ from the laser diode 1 is not coupled.

The strip waveguide sections 1200 and 1220 and the directional coupler 30 can be realized by the layer 12 described in connection with FIGS. 1 through 4.

Although modifications and changes may be suggested by those skilled in the art it is the intention of the inventors to embody within the patent warranted hereon all changes and modifications as reasonably and properly come within the scope of their contribution to the art.

We claim as our invention:

1. In an integrated structure, the combination comprising:
    a substrate;
    a laser diode integrated on said substrate;
    a photodetector integrated on said substrate;
    a bi-directional optical waveguide integrated on said substrate disposed for guiding radiation from said laser diode out of said structure and for directing incoming radiation of a different wavelength through said structure to said photodetector; and
    a passive optical device coupled in said integrated structure with said waveguide for substantially isolating said incoming radiation propagated in one direction in said waveguide from said laser diode and substantially isolating radiation emitted by said laser diode propagated in an opposite direction in said waveguide from said photodetector.

2. A combination as claimed in claim 1 wherein said waveguide comprises a first branch disposed between an end face of said substrate and said laser diode, and a second branch disposed between said first branch and said photodetector, said passive optical device being disposed in a radiation propagating paths between said first and second branches.

3. A combination as claimed in claim 2 wherein said first and second branches are connected and wherein said passive optical device includes a wavelength selecting grating formed on said first and second branches at the connection thereof.

4. A combination as claimed in claim 3 wherein said first and second branches are disposed perpendicularly to each other.

5. A combination as claimed in claim 4 wherein said wavelength selecting grating is disposed only within a portion of the width of said first branch of said waveguide.

6. A combination as claimed in claim 4 wherein said wavelength selecting grating is comprised of a plurality of spaced parallel grooves having a constant spacing therebetween for deflecting radiation of said different wavelength.

7. A combination as claimed in claim 4 wherein said wavelength selecting grating is comprised of a plurality of spaced grooves disposed obliquely with respect to each of said radiation propagation directions.

8. A combination as claimed in claim 2 wherein said passive optical device is a directional coupler disposed in a region of said substrate in which said first and second branches are disposed a distance close to but spaced from each other such that said incoming radiation is coupled from said first branch to said second branch and radiation from said laser diode is not coupled therebetween.

9. A combination as claimed in claim 1 wherein said laser diode is a DFB laser diode.

10. A combination as claimed in claim 1 wherein said laser diode and said photodetector are disposed on a common major face of said substrate, and wherein an additional passive optical device consisting of a deflector element is disposed between said strip waveguide and said photodetector for coupling radiation of said different wavelength therebetween.

11. A combination as claimed in claim 1 wherein said substrate has a recess in a face thereof on which said strip waveguide is integrated, and wherein said photodetector is at least partially integrated in said recess such that radiation of said different wavelength is transmitted between said strip waveguide and said photodetector by end face coupling.

12. A combination as claimed in claim 1 comprising in sequence on said substrate:
    a first layer disposed on a surface of said substrate;
    a second layer disposed on said first layer forming said strip waveguide, said second layer having a refractive index greater than the refractive index of said first layer;
    a laser-active layer disposed on said second layer partially covering said second layer leaving a remainder of said second layer uncovered;
    a third layer having a grating therein for reflecting radiation from said laser-active layer disposed on an coextensive with said laser-active layer, said third and laser-active lasers forming essential parts of said laser diode;
    a fourth layer on said third layer and said remainder of said second layer, said fourth layer having a refractive index lower than said refractive index of said second layer and having a boundary with said second layer;
    said fourth layer being of a first conductivity type and said substrate, said first layer and said second layer being a second, opposite conductivity type;
    a fifth layer of said first conductivity type disposed on said fourth layer;
    a sixth layer disposed on said fifth layer and partially covering said fifth layer, said sixth layer having a region of said second conductivity type, said sixth layer forming said photodetector; and
    said second layer having a first deflector grating therein of said boundary between said second layer and said fourth layer forming at least part of said passive optical device for substantially blocking radiation emitted by said laser-active layer from reaching said sixth layer and also blocking said incoming radiation from reaching said laser-active layer.

13. A combination as claimed in claim 12 further comprising a second deflection grating disposed in said second layer below said sixth year for deflecting at least a portion of the radiation guided in said second layer to said photodiode.

14. A combination as claimed in claim 12 wherein said substrate has a step therein forming a recess on said surface, said first and second layers terminating substantially coincident with said step and having respective end faces substantially coplanar with said step, wherein said fourth layer extends over said step covering said end faces of said first and second layers and is disposed in said recess adjacent said substrate, and wherein said fifth and sixth layers extend over said step and at least partially into said recess, such that said photodiode is disposed at least partially within said recess and radiation is coupled between said second layer and said photodiode through the end face of said second layer.

15. A combination as claimed in claim 12 wherein said region of second conductivity type in said sixth layer is a sub-layer of said second conductivity type disposed over said sixth layer.

16. A combination as claimed in claim 12 wherein said region of a second conductivity type in said sixth layer is a diffusion zone within said sixth layer.

17. A combination as claimed in claim 16 further comprising a cover layer disposed over said fifth layer and said sixth layer, said cover layer having an opening therein substantially coextensive with said region of said second conductivity type in said sixth layer.

18. An integrated structure as claimed in claim 2 wherein said first and second branches are connected and wherein said passive optical device includes an angled radiation-reflecting surface formed between said first and second branches at the connection thereof.

19. An integrated structure as claimed in claim 10 wherein said passive optical device includes a grating disposed in said optical strip waveguide below said photodetector.

20. An integrated structure as claimed in claim 10 wherein said passive optical device includes a radiation-reflecting angled surface disposed in said optical strip waveguide below said photodetector.

21. An integrated structure as claimed in claim 10 wherein said laser diode and said photodetector are disposed on opposite major faces of said substrate, and wherein said optical device includes a deflector element disposed between said strip waveguide and said photodetector for coupling radiation of said different wavelength therebetween.

22. An integrated structure as claimed in claim 21 wherein said deflector element is an angled radiation-reflecting surface in said strip waveguide.

23. An integrated structure as claimed in claim 21 wherein said deflector element is a grating disposed in said strip waveguide.

* * * * *